United States Patent
Gilbert et al.

(10) Patent No.: US 9,361,975 B2
(45) Date of Patent: Jun. 7, 2016

(54) SENSING DATA IN RESISTIVE SWITCHING MEMORY DEVICES

(71) Applicant: Adesto Technologies Corporation, Sunnyvale, CA (US)

(72) Inventors: Nad Edward Gilbert, Gilbert, AZ (US); John Dinh, Dublin, CA (US); John Ross Jameson, III, Menlo Park, CA (US); Michael N. Kozicki, Phoenix, AZ (US); Shane Charles Hollmer, Grass Valley, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 370 days.

(21) Appl. No.: 13/793,685

(22) Filed: Mar. 11, 2013

(65) Prior Publication Data
US 2014/0254238 A1 Sep. 11, 2014

(51) Int. Cl.
G11C 13/00 (2006.01)

(52) U.S. Cl.
CPC .......... *G11C 13/004* (2013.01); *G11C 13/0002* (2013.01); *G11C 13/0007* (2013.01); *G11C 13/0011* (2013.01); *G11C 13/0069* (2013.01); *G11C 2013/0073* (2013.01)

(58) Field of Classification Search
USPC ................................. 365/148, 158
See application file for complete search history.

(56) References Cited

U.S. PATENT DOCUMENTS

| | | | |
|---|---|---|---|
| 7,151,688 B2 | 12/2006 | Williford et al. | |
| 7,463,536 B2 * | 12/2008 | Scheuerlein | G11C 5/063 365/148 |
| 7,642,125 B2 * | 1/2010 | Lung | H01L 27/2436 257/5 |
| 8,072,795 B1 * | 12/2011 | Wang et al. | 365/148 |
| 8,218,350 B2 * | 7/2012 | Kozicki | G11C 11/5614 257/296 |
| 8,274,842 B1 | 9/2012 | Hollmer et al. | |
| 8,913,444 B1 | 12/2014 | Gilbert et al. | |
| 2008/0304312 A1 * | 12/2008 | Ho | B82Y 10/00 365/148 |
| 2011/0222329 A1 * | 9/2011 | Tsukada | 365/72 |
| 2012/0044736 A1 * | 2/2012 | Chung | 365/66 |
| 2014/0063892 A1 * | 3/2014 | Yip | G11C 7/18 365/72 |

OTHER PUBLICATIONS

Otsuka, et al., "A 4Mb Conductive-Bridge Resistive Memory with 2.3GB/s Read-Throughput and 216MB/s Program-Throughput," Solid-State Circuits Conference Digest of Technical Papers (ISSCC), 2011 IEEE International, pp. 210-211, Date of ISSCC Conference: Feb. 20-24, 2011.

* cited by examiner

*Primary Examiner* — Huan Hoang
*Assistant Examiner* — Minh Dinh
(74) *Attorney, Agent, or Firm* — Michael C. Stephens, Jr.

(57) ABSTRACT

Structures and methods of operating a resistive switching memory device are disclosed herein. In one embodiment, a resistive switching memory device can include: (i) a plurality of resistive memory cells, where each of the resistive switching memory cells is configured to be programmed to a low resistance state by application of a first voltage in a forward bias direction, and to be erased to a high resistance state by application of a second voltage in a reverse bias direction; and (ii) a sensing circuit coupled to at least one of the plurality of resistive memory cells, where the sensing circuit is configured to read a data state of the at least one resistive memory cell by application of a third voltage in the forward bias direction or the bias reverse direction.

20 Claims, 13 Drawing Sheets

SENSING DATA IN RESISTIVE SWITCHING MEMORY DEVICES

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device with bipolar sensing operations.

In one embodiment, a resistive switching memory device can include: (i) a plurality of resistive memory cells, where each of the resistive switching memory cells is configured to be programmed to a low resistance state by application of a first voltage in a forward bias direction, and to be erased to a high resistance state by application of a second voltage in a reverse bias direction; and (ii) a sensing circuit coupled to at least one of the plurality of resistive memory cells, where the sensing circuit is configured to read a data state of the at least one resistive memory cell by application of a third voltage in the forward bias direction or the reverse bias direction.

In one embodiment, a resistive switching memory device can include: (i) a plurality of resistive memory cells, where each of the resistive switching memory cells is configured to be programmed to a low resistance state by application of a first voltage in a forward bias direction, and to be erased to a high resistance state by application of a second voltage in a reverse bias direction; and (ii) a linearity detector configured to determine a data state of a selected resistive memory cell of the plurality of resistive memory cells by detecting whether an IV curve for the selected resistive memory cell is linear or nonlinear.

In one embodiment, a resistive switching memory device can include: (i) a plurality of resistive memory cells, where each of the resistive switching memory cells is configured to be programmed to a low resistance state by application of a first voltage in a forward bias direction, and to be erased to a high resistance state by application of a second voltage in a reverse bias direction; and (ii) a bidirectional resistance detector configured to determine a data state of a selected resistive memory cell of the plurality of resistive memory cells by detecting whether a resistance of the selected resistive memory cell is bidirectional or non-bidirectional.

In one embodiment, a method of controlling a resistive switching memory device, can include: (i) determining an operation to perform on a resistive memory cell in the resistive switching memory device; (ii) performing at least one program attempt with a first forward bias across the resistive memory cell and at least one program verify with a second forward bias across the resistive memory cell when the determined operation is a program operation; (iii) performing at least one erase attempt with a first reverse bias across the resistive memory cell and at least one erase verify with a second reverse bias across the resistive memory cell when the determined operation is an erase operation; and (iv) determining a data state of the memory cell when the determined operation is a read operation.

Embodiments of the present invention can advantageously provide for reduced cell disturb for verify operations after program and erase cycles. Particular embodiments are suitable for resistive switching memories, such as resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Figure 1:
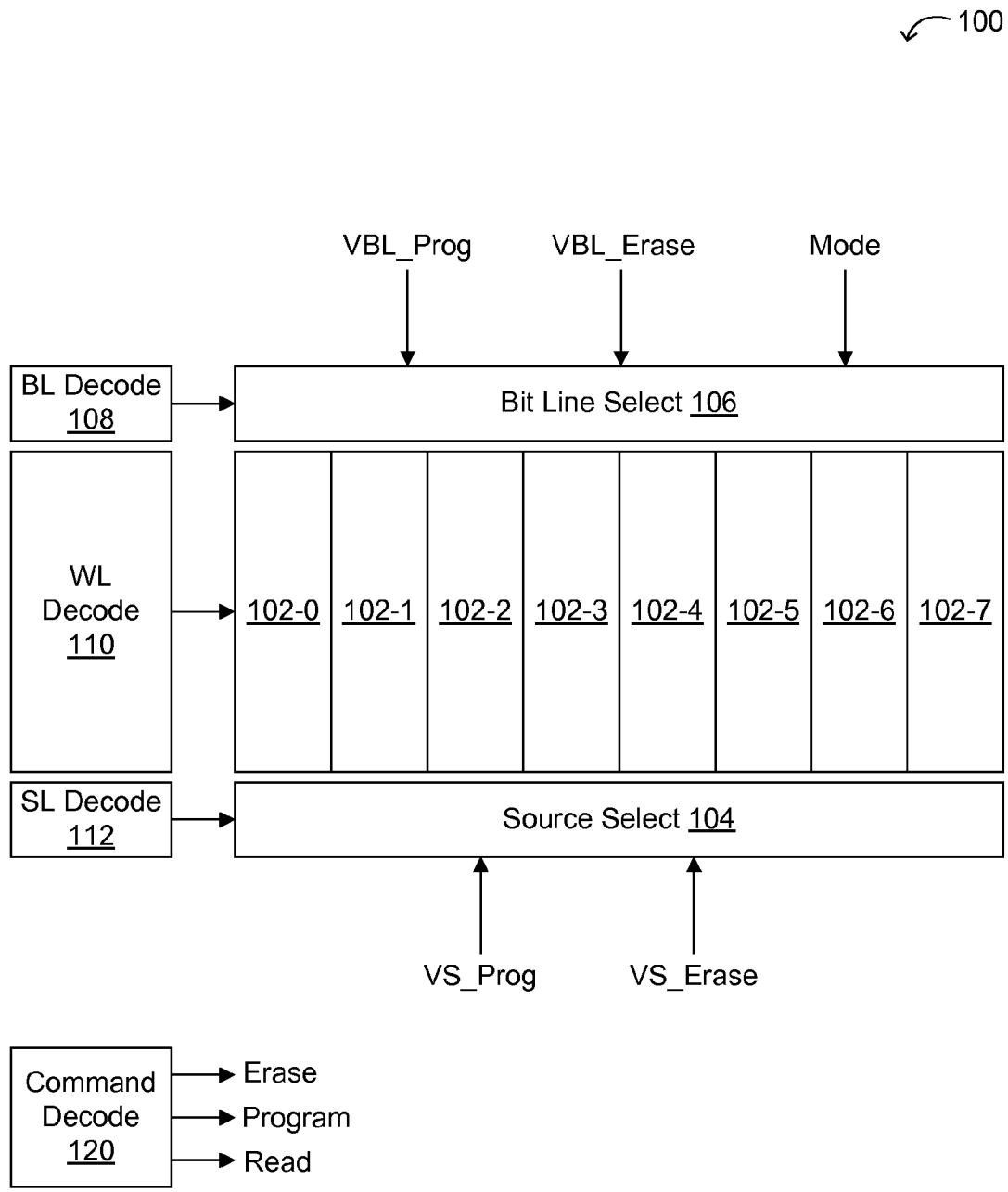
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain," and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to resistive switching memories, such as programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating resistive switching memories (e.g., programmable metallization cells [PMCs]) that can be programmed/written and erased between one or more resistance and/or capacitive states.

Figure 2:
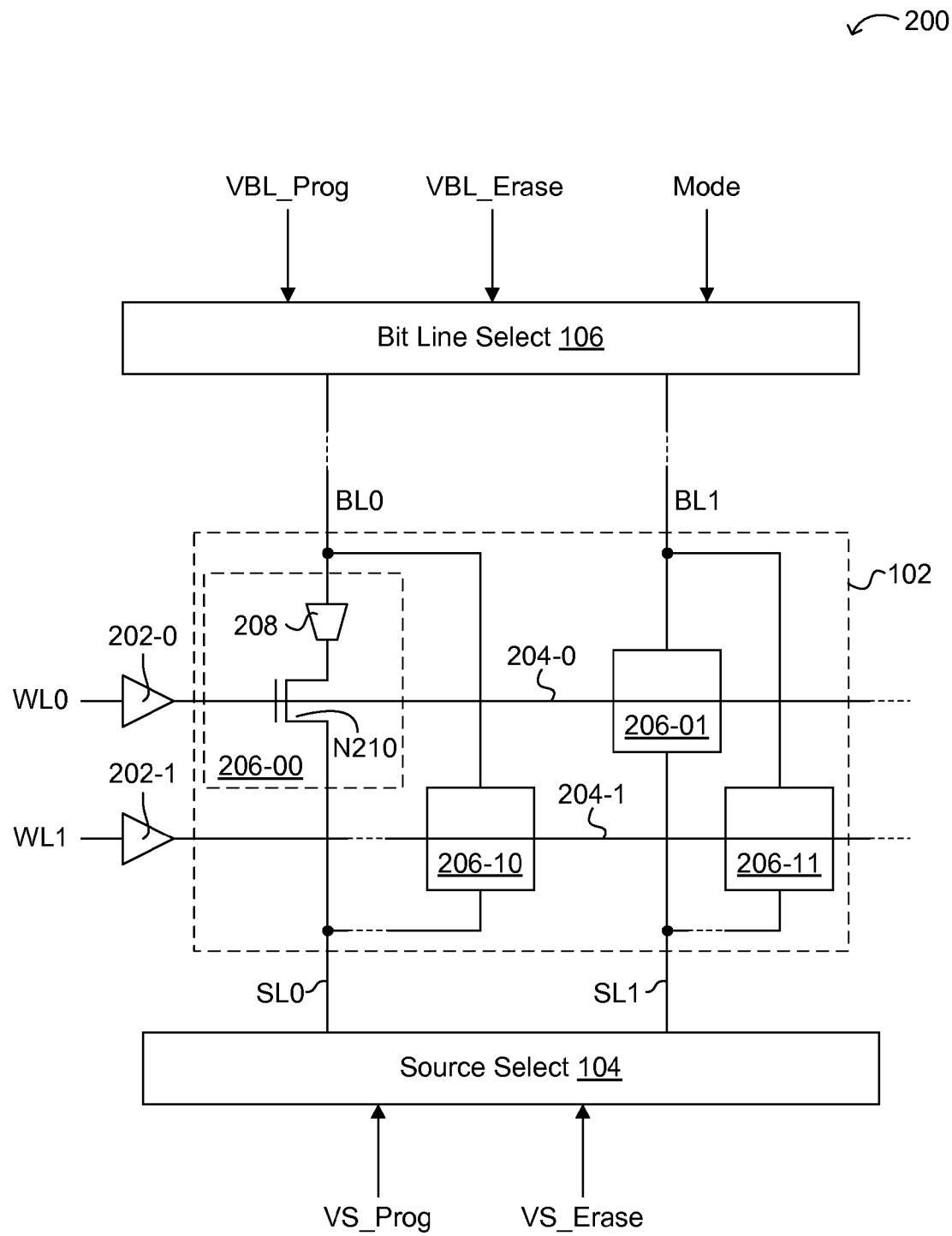
FIG. 2 is a schematic block diagram of an example memory device and memory cell structure.

FIGS. 1 and 2 show example memory architectures and circuit structures that can utilize PMCs. However, particular embodiments are amenable to a wide variety of memory architectures, circuit structures, and types of resistive switching memories.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, particular embodiments are suitable for use in any type of PMC memory, or other type of resistive switching memory, device architecture.

PMC sectors (102-0 to 102-7) in this particular example may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions.

Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1-V2) in an anode-to-cathode direction. In an erase operation, a PMC to be erased can be connected between suitable voltages (e.g., V2-V1) in an cathode-to-anode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be equal to an erase voltage, which may both be within the range of a supply voltage (Vprog=V1-V2, Verase=V2-V1, Supply voltage=maximum of V1 and V2). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a resistive switching memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell, thus placing its corresponding select device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture.

Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltage and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
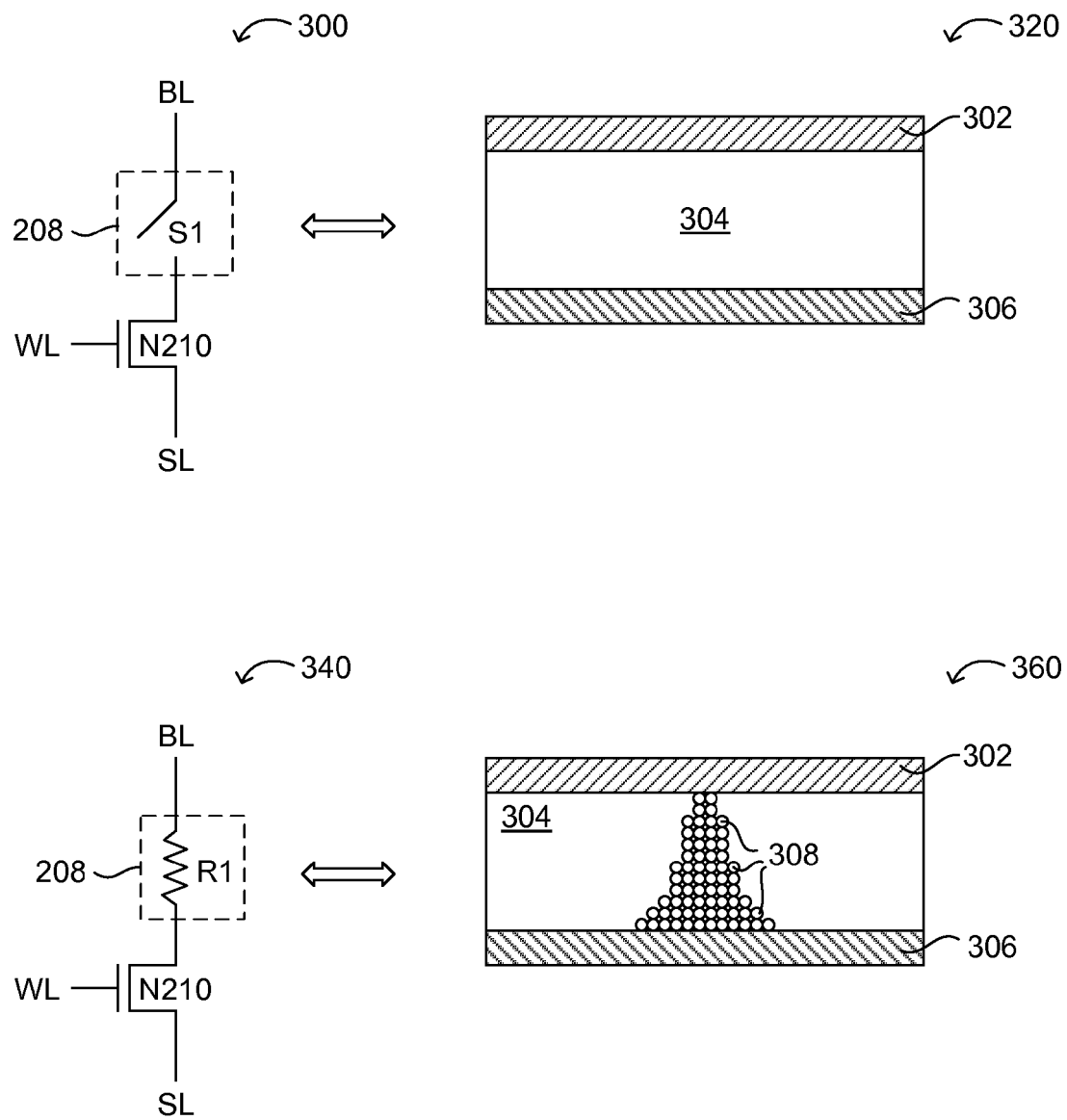
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of PMC 208. The PMC portion of this representation corresponds to the cross-section diagram 320, which represents a PMC or programmable impedance element in a high impedance state (e.g., data state "0"), or an erased state. As used herein, "PMC" may be one example of a "programmable impedance element." Programmable impedance elements can also include any type of resistive switching or resistance-change memory cells or elements. In one example, PMC 320 can include electrochemically active electrode 302, solid electrolyte 304, and inert electrode 306. The example PMC 320 may represent a strong or substantially erased state of the cell. As shown, substantially no conductive path between active electrode 302 and inert electrode 306 is seen in PMC 320.

Schematic representation 340 and corresponding cross-section diagram 360 show examples of PMC 208 in a low impedance state (e.g., data state "1"), or a programmed state. For example, example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in example PMC 360, a full conductive path may be formed between active electrode 302 and inert electrode 306 by electrodeposits 308.

As shown in examples 300 and 340, a control transistor (e.g., N210) can also be included in each memory cell including the programmable impedance element or PMC 208. For example, transistor N210 can be controlled by a word line 204, as discussed above with respect to FIG. 2. Transistor N210 may be an access transistor to allow PMC 208 to be programmed and erased.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes.

Various materials can be utilized to form electrodes 302 and 306. For example, inert electrode 306 can include tungsten, and electrochemically active electrode 302 can include silver, copper, or their metal compound. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 µA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC may be substantially symmetric to a program operation.

In conductive bridging random-access memory (CBRAM) applications, metal ions can dissolve readily in the material (e.g., 304) between the two electrodes (e.g., 302 and 306). However, in resistive RAM (ReRAM) applications, the material between the electrodes may require a high electric field that can cause local damage and may produce a trail of conducting defects (a "filament"). Thus, for CBRAM, one electrode provides the dissolving ions, while for ReRAM, a one-time "forming" step may be required to generate the local damage. Particular embodiments, however, are suitable for any type of resistive switching or resistance-change memory cell, element, or device.

Figure 4:
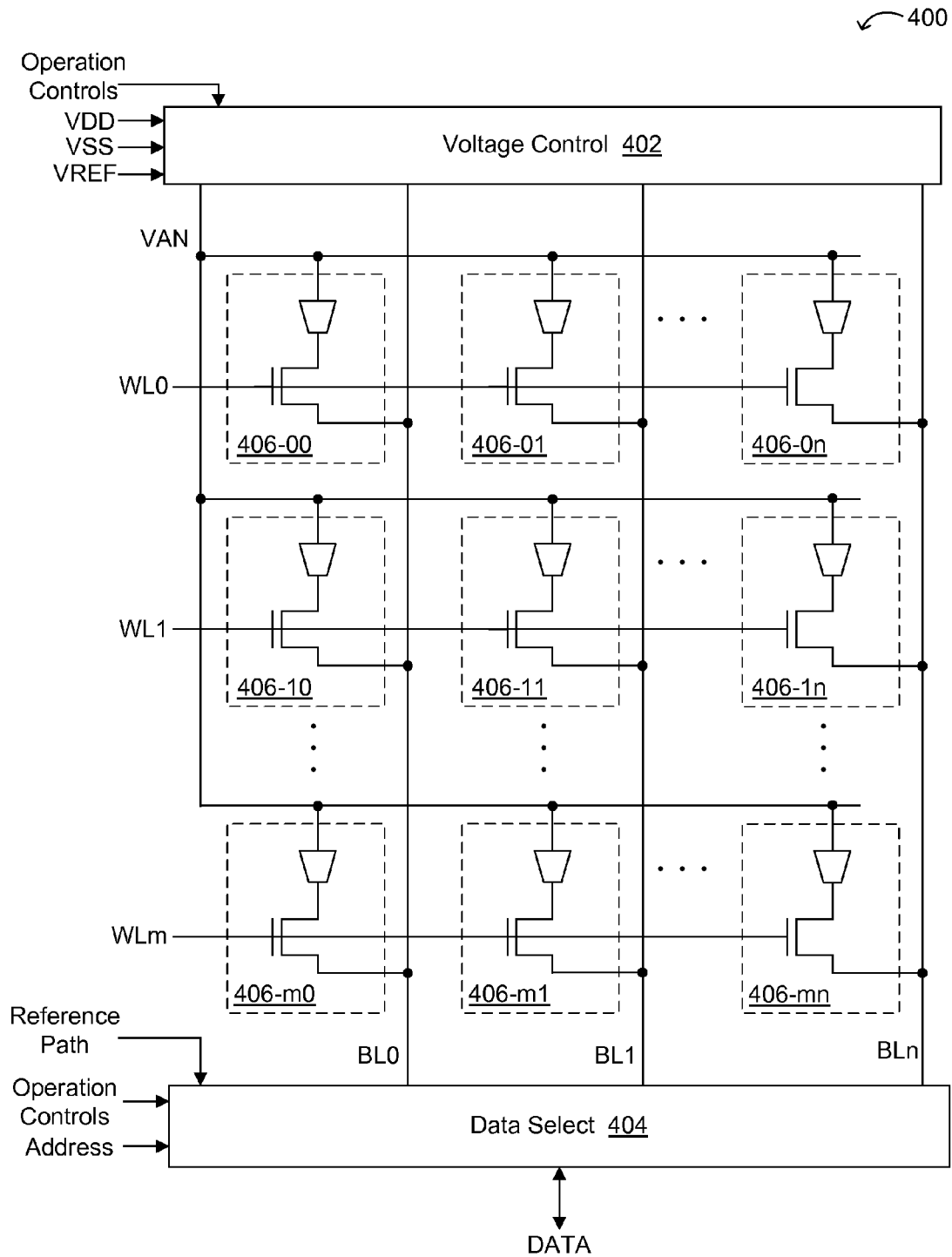
FIG. 4 is a schematic block diagram of an example common anode array structure.

Referring now to FIG. 4, shown is a schematic block diagram of an example common anode array structure 400. In this example, voltage control 402 can receive various supply voltages (e.g., VDD, VSS, VREF, etc.), as well as operation controls (e.g., program, erase, verify, read, etc.). Resistive memory cells 406 can include a programmable impedance element and an access transistor as shown. In this particular arrangement, the anode of each memory cell 406 can connect together in a common anode structure. For example, the common anode can be a large plate structure that may be biased at a voltage VAN generated by voltage control 402. Of course, other voltage generation control and regulated levels, as discussed above, can be utilized in certain embodiments.

In this example, data select 404 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed decoded. In addition, word line (WL0, WL1, . . . WLm) decoding can be utilized for activation of the appropriate word line for a given cycle.

Further, a reference path can also be coupled to data select 404. The reference path can be used by a sensing circuit in order to compare against a regular bit line. For example, a current from a selected bit line and its selected memory cell 406 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is the strapped source structure, as discussed above. In any event, particular embodiments are suitable to a wide variety of resistive memory cell architectures and arrangements.

Data select 404 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. In particular embodiments, a common bipolar sensing circuit can be employed in each of these operations. In particular, the bipolar sensing circuit can allow for a program verify to be performed using a same forward bias (anode voltage higher with respect to cathode voltage) on the memory cell as was used to program the memory cell. Similarly, the bipolar sensing circuit can allow for an erase verify to be performed using a same reverse bias (cathode voltage higher with respect to anode voltage) on the memory cell as was used to erase the memory cell.

Sensing circuits for resistive switching memory (e.g., CBRAM) technology may require discriminating resistive loads. It is desirable to perform the sensing as fast as possible while expending the least amount of energy as possible. The accuracy of the measurement is another consideration because this represents determination of a data state stored in the memory cell. In measurement accuracy, voltage and current offset due to circuit mismatch, parasitic or inherent capacitances, etc., must also be addressed. As will be discussed in more detail below, properties of the resistive memory cell (e.g., IV characteristics, directional resistance, etc.) can be exploited to improve the output of the sensing operation, and to detect additional data states stored within the memory cell.

Sensing circuits in particular embodiments also aim to minimize disturbance of the accessed cell resistance during the read operation to determine a data state from that cell. Thus, a cell that is programmed (e.g., in a data state 1) should remain in that state after a program verify or standard read operation, and a cell that is erased (e.g., in a data state 0) should remain in that state after an erase verify or standard read operation. The CBRAM cell may generally be programmed with a forward bias voltage (positive with respect to anode and cathode), and may be erased with a reverse bias voltage (negative with respect to anode and cathode). Also, there may be an applied voltage time limit for verify/read operations that is observed to ensure the resistance of the memory cell is not substantially disturbed. This issue may be more of a concern when program verify and erase verify occur with relatively larger voltages. Also, the energy required to obtain such a relatively large voltage may be wasted when that large voltage is shifted back to relatively small voltages that are commonly used for standard read operations. The energy can be lost due mainly to the switching of the common anode plate, as opposed to bit line voltage during sensing.

Various voltages for bit lines and the common anode plate can be supported in particular embodiments. For example, in a program operation the common anode plate may be in a range of from about 2.2V to about 3V. For a program verify operation, the bit line may be set to about 1.2V and the common anode plate may be about 1.4V. Voltages can also be changed depending on the bias direction (forward or reverse) for a read operation. For a normal forward read, the common anode plate may be about 0.4V, and the bit line can be forced to about 0.2V by the read circuit. For an erase operation, the common anode plate can be about 0V. For an erase verify operation, the read circuit may force the bit line to about 1.2V, and the common anode plate can be about 0V. For a normal reverse bias read, the read circuit can force the bit line to about 0.2V, and the common anode plate can be about 0V.

In certain embodiments, to reduce the device exposure and possible cell disturb, and to allow for relatively large voltages during an erase verify operation, a reverse bias read circuit that self limits the applied voltage can be used when reading a programmed cell. One particular example method of sensing in this fashion and an example associated apparatus will be discussed below with reference to FIGS. 11 and 12.

To address bidirectional resistance characteristics, and to provide more efficient program and erase verify operations, bidirectional read circuits and methods are described herein. In one example, forward direction reading (e.g., for a common anode architecture) can be implemented with current subtraction. Examples of bipolar or bidirectional sensing circuits will be discussed below with reference to FIGS. 6, 7, and 8. Advantages of such approaches include use of a larger voltage when doing the erase verify. The larger erase voltage may allow for a larger (e.g., about 5× larger) erase verify current, allowing for a reasonable access time (e.g., about 100 ns) to verify equivalently larger resistances at low voltages. For example, a 5 Meg device may have an erase verify current of about 1.2 uA at an erase verify level of about 1.2V, while an erase verify at about 0.2V may require about a 40 nA current trip point. A reasonable access time of about 100 ns may be very difficult to achieve with 40 nA trip points, and offsets in the sense amplifier can effectively override such low currents.

Particular embodiments may also utilize data dependency, such that only memory cells that are being programmed or erased in a given operation may be verified with a relatively large voltage, thus reducing the possibility of disturb. Thus, verify operations may be targeted to resistive memory cells recently programmed or erased. Particular embodiments can also be used to determine bidirectional resistance differences, such as a lower resistance detection when measured in a reverse bias direction as compared to a forward bias direction resistance measurement, which can also be indicators of the data state of the memory cell. Also, the resistance of a memory cell can depend on voltage, and this can allow the state of the memory cell to be determined by the shape of the IV curve, instead of necessarily considering the magnitude of the current or resistance value. Examples of such characteristics and methods will be discussed below with reference to FIGS. 9 and 10.

Figure 5:
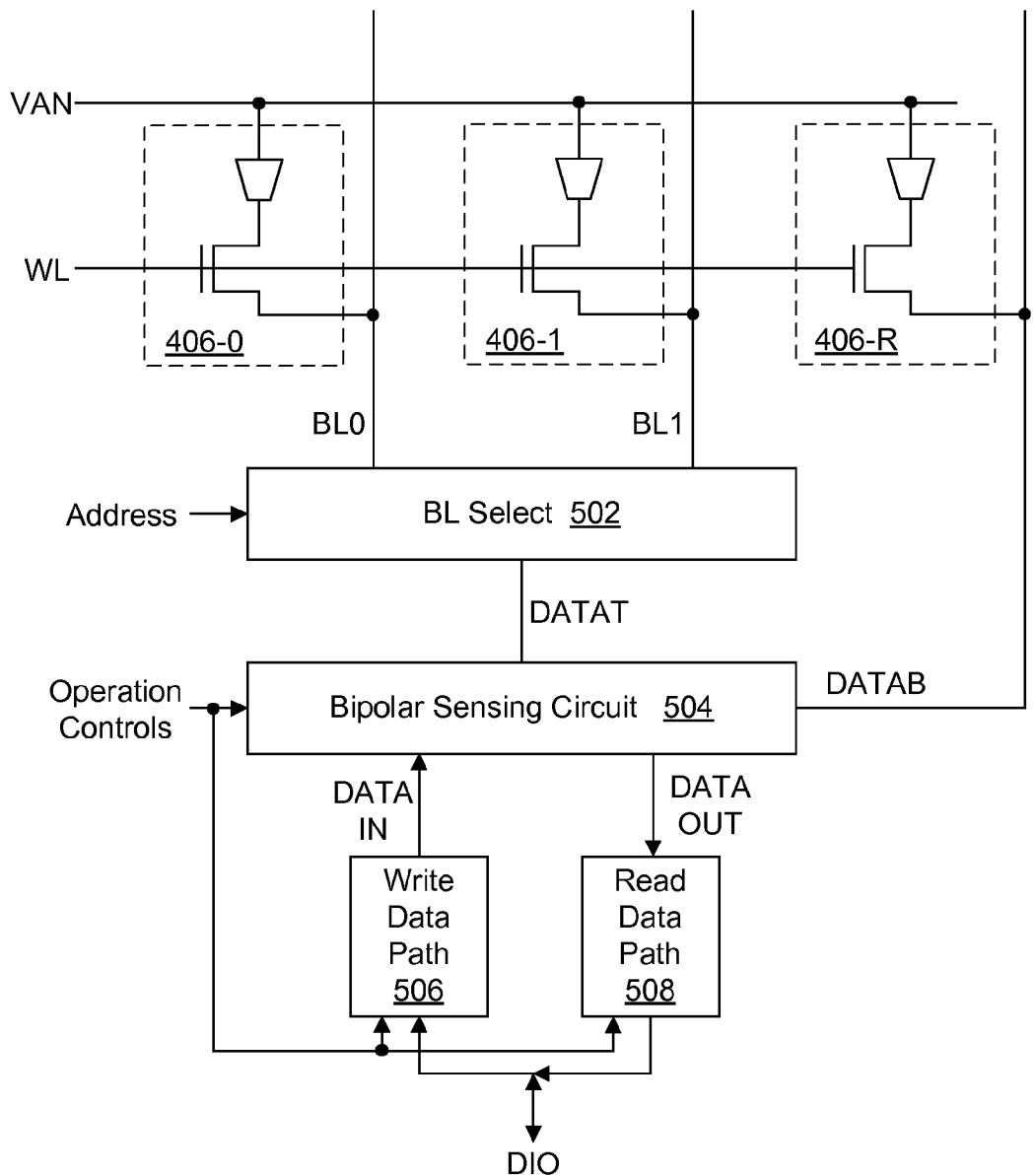
FIG. 5 is a schematic block diagram of an example bipolar sensing circuit arrangement in accordance with embodiments of the present invention.

Referring now to FIG. 5, shown is a schematic block diagram of an example bipolar sensing circuit arrangement 500 in accordance with embodiments of the present invention. In this example, two regular memory cells 406-0 and 406-1, as well as one reference memory cell 406-R are shown. It is understood, however, that other memory cells 406, word lines, and other components and arrangements, are also included. In this particular example, bit line select circuitry 502 can be controlled by address decoding, and may select one of bit lines BL0 and BL1 for coupling to bipolar sensing circuit 504 via DATAT.

Bipolar sensing circuit 504 can also receive operation control signals. These signals can be used to control activation of read data path 508, write data path 506, and sensing circuitry in circuit 504, as appropriate for the given command. For example, read data path 508 may be activated for a read operation, a program verify operation, or an erase verify operation. Also, write data path 506 may be activated for a program or erase operation. In particular embodiments, common bipolar sensing circuit 504 can be employed in each of these operations. In particular, bipolar sensing circuit 504 can allow for a program verify to be performed using a same forward bias (anode voltage higher with respect to cathode voltage) on the memory cell as was used to program the memory cell. Similarly, bipolar sensing circuit 504 can allow for an erase verify to be performed using a same reverse bias (cathode voltage higher with respect to anode voltage) on the memory cell as was used to erase the memory cell.

The majority of non-volatile memory (NVM) methodologies utilize predetermined program and erase verify levels. This can allow for the read margins to be increased even if there is drift in the program and erase resistance of the memory cell. In some approaches, the same read voltage levels may be maintained, and only the current may be changed. In particular embodiments, the same read or sensing circuit can be used to perform a regular read, as well as program/erase verify operations. Use of the same sensing circuitry for these operations can improve correlation therebetween. In addition, changing the current may negatively impact sense amplifier performance, and can result in reduced margins. This may be particularly the case for the erase verify level, which can involve a relatively large resistance value with relatively small currents.

Figure 6:
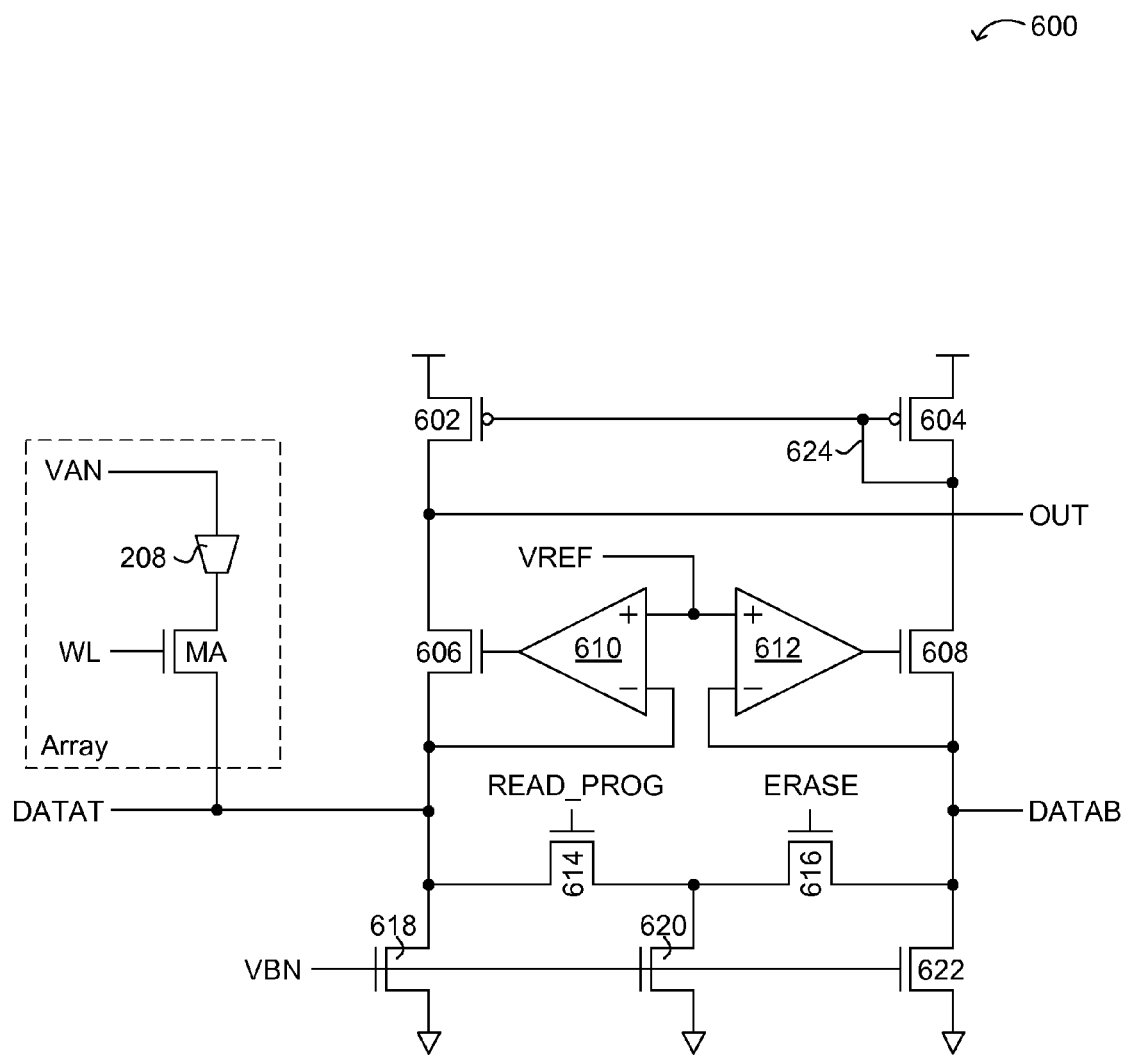
FIG. 6 is a schematic block diagram of a first example bipolar sensing circuit in accordance with embodiments of the present invention.

Referring now to FIG. 6, shown is a schematic block diagram of a first example bipolar sensing circuit 600 in accordance with embodiments of the present invention. In this particular example, the array (including a memory cell with a programmable impedance element 208) can be coupled to the bipolar sensing circuit via DATAT. DATAB can be coupled to a reference bit line or other reference structure or, alternatively, to another memory cell in a two memory cell per data state structure. PMOS transistors 602 and 604 can have a common gate connection at node 624, and each may have a source connected to a power supply VDD. Because the gate and drain of transistor 604 may also be coupled to the gate of transistor 602, the current through transistor 604 may be mirrored through transistor 602.

NMOS transistor 606 can have its drain connected to the OUT node, its source connected to DATAT and the negative terminal of amplifier 610, and its gate can connect to an output of amplifier 610. Similarly, NMOS transistor 608 can have its drain connected to node 624, its source connected to DATAB and the negative terminal of amplifier 612, and its gate can connect to an output of amplifier 612. Also, a regulated reference voltage VREF can connect to the positive terminals of amplifiers 610 and 612. In this arrangement, a voltage at DATAT can essentially be forced to follow VREF. If a voltage at DATAT rises above VREF, an output of amplifier 610 can be driven lower, which can increase the resistance through transistor 606. If a voltage at DATAT goes below VREF, an output of amplifier 610 can be driven higher, which can decrease the resistance through transistor 606. Thus, transistor 606 can act as a current regulation device.

A bias voltage VBN can be supplied to the gates of NMOS transistors 618, 620, and 622. Read or program operation control signals can control NMOS transistor 614, which may have its source and drain connected between the drains of transistors 618 and 620. An erase operation control signal can control NMOS transistor 616, which may have its source and drain connected between the drains of transistors 620 and 622. Pull-down transistors 618 and 620 can be activated to sink current on DATAT during a forward bias read, and depending on the resistance of current regulation device 606.

In particular embodiments, bipolar sensing circuit 600 can be used for forward bias sensing for the program verify and read, and reverse bias sensing for the erase verify operation. In this way, the verify operations may have a same bias direction across the memory cell as the corresponding program/erase operation. Thus, the previous program/erase operation may be enhanced during the corresponding verify operation, as opposed to being exposed to possible disturb due to an opposite polarity biasing of the memory cell.

During read and program operation, current may be sourced into the sensing circuit from the array (via node DATAT) and compared to the reference current (via node DATAB). The over current may then be compared to obtain the data state of the memory cell. However, during program operations, the memory cell anode voltage may be set to about 1V, and reference voltage VREF may be set to about 0.2V to reinforce programming, and to increase the sensing current. During erase verify, the anode voltage may be set to about 0V, and reference voltage VREF can be set to about 0.6V. Of course, other voltages or voltage combinations may also be employed in particular embodiments. In any event, the larger voltage used can allow for larger currents from the resistive memory (e.g., CBRAM, PMC, etc.) cell. For example, the nonlinear nature of the PMC can allow for larger currents at a larger bias, which thus may improve erase verify levels and allow the sense circuit to operate at larger currents. In this way, a bipolar sensing circuit can allow for program/erase verify with the same read circuit so that program and erase cell states are reinforced during the corresponding verify operations.

Figure 7:
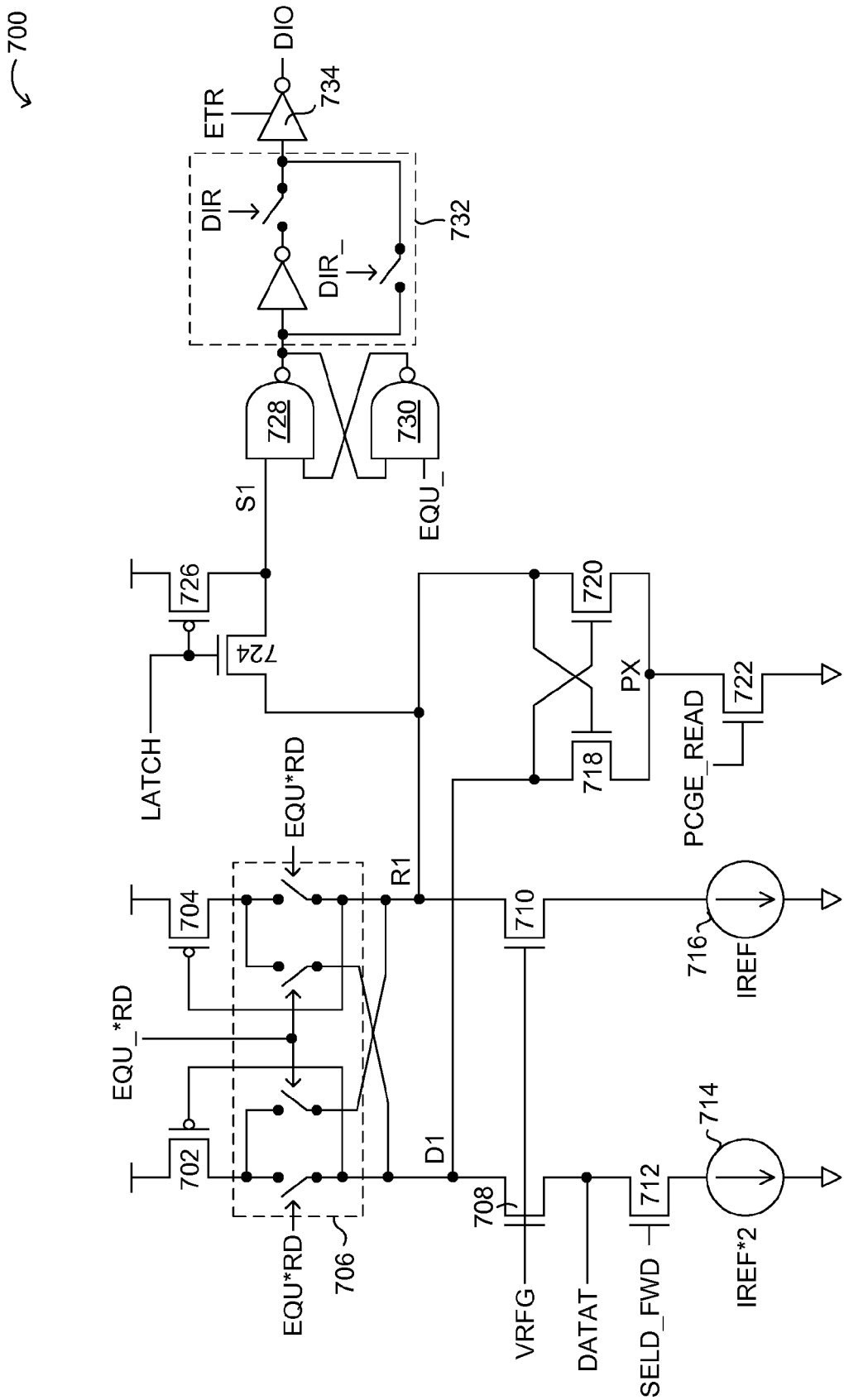
FIG. 7 is a schematic block diagram of a second example bipolar sensing circuit in accordance with embodiments of the present invention.

Referring now to FIG. 7, shown is a schematic block diagram of a second example bipolar sensing circuit 700 in accordance with embodiments of the present invention. This particular example utilizes a switchable current load and a cross-coupled PMOS load. PMOS transistors 702 and 704 can be diode-connected or cross-coupled depending upon the states of switches 706. NMOS transistors 708 and 710 can be controlled by a reference voltage VRFG, which may be equal to VREF+VGS(IREF). In one application, VRFG can be set globally on the resistive switching memory device. DATAT can be coupled to the memory cell accessed from the memory array.

NMOS transistor 712 can be controlled by direction indicator signal SELD_FWD, and may have its drain connected to DATAT, and its source connected to current source 714 to VSS. For example, current source 714 may be twice IREF, which can be IRF or IPR, and may be set globally on the resistive switching memory device. Similarly, current source 716 can be connected between a source of transistor 710, and VSS. For example, current source 716 may have a current of IREF. Also, direction indicator signal SELD_FWD can indicate whether the read is a forward bias read or a reverse bias read as to the anode and cathode of the programmable impedance element in the accessed memory cell.

Node D1 can connect to a drain of NMOS transistor 718, and a gate of NMOS transistor 720. Node R1 can connect to a drain of transistors 720, and a gate of transistor 718. The sources of transistors 718 and 720 can connect at node PX. Also, NMOS transistor 722 can be connected to node PX at its drain, to VSS at its source, and to control signal PCGE_READ in its gate. For example, control signal PCGE_READ can be used to speed up a read or sensing operation by sinking current at node PX. A latch control signal can connect to the gates of NMOS transistor 724 and PMOS transistor 726. Thus, when the latch control signal is high, the value on node R1 can be allowed to pass through via node S1 to the SR flip-flop formed by NAND-gates 728 and 730. In contrast, when the latch control signal is low, node R1 can be isolated from node S1, which can be pre-charged high via transistor 726.

The output read from sensing circuit 700 can be latched by way of the SR flip-flop, which can be reset when the equalization signal EQU is activated (EQU_is low). For example, equalization signal EQU can allow for the PMOS transistor 702/704 load to be configured as diode-connected transistors at the start of a read operation, and to reset the latch structure including the SR flip-flop. The directionality of the output can be set to the proper polarity by direction control signal DIR and the inverter and switch structure 732. Thus, depending on whether the read was a forward bias read or a reverse bias read, direction control signal DIR and circuitry 732 can be used to provide the appropriate output at DIO via enabled inverter 734.

In particular embodiments, current and/or voltage polarity of the sense amplifier can be inverted for common cathode or bit line anode architectures. The sensing may also be performed with capacitive decay. In any event, margins can be improved by taking advantage of the nonlinear nature of the resistance of resistive memory cells (e.g., PMC) in order to improve program/erase verify levels. The program verify operation may have a reduced voltage as compared to conventional approaches to reduce resistance levels, and to limit exposure of the memory cell to verify voltages could otherwise cause disturb of the cell data. This may be done even if program/erase reinforcement by way of sensing for verify operations being in the same bias direction as the corresponding program/erase operations were not necessary.

Thus in particular embodiments, a program or erase operation on a resistive memory cell may have a follow-on verify operation that utilizes a read in a same bias direction in which the cell was programmed or erased. Thus, a program verify operation can employ a forward bias (anode with respect to cathode) read, while in erase verify can employ a reverse bias read. In this way, the anode voltage may not have to be switched as much as in other approaches, and the forward sensing can be used with a higher reference voltage to maintain a relatively low bias across the memory cell. In addition, reduced anode switching can result in substantial power savings for common anode architectures because the anode is essentially a large common plate with an associated high capacitance.

For erased memory cells, a nonlinear resistance of the memory cell may be seen, and thus a larger voltage may be utilized in the reverse direction to sense in order to verify the erase. In this way, a verify operation with larger currents for the larger resistances of the erased memory cell may be returned to a normal or lower bias for a standard read operation. This is in contrast to approaches that would always read the memory cell in one bias direction. Rather, sensing approaches as described herein can read a memory cell in both bias directions, or either direction based on the particular operation (e.g., program, erase) to verify. For example, to verify a program operation, a special forward read can be employed to verify the program with a higher voltage because the anode may already be at that high voltage from the previous program operation.

For an erase operation, the common anode may be at a ground level to perform the erase, which can be a reverse bias direction. Then, a larger voltage can be applied to the bit line coupled to the cathode to perform the erase verify operation. Thus, a relatively large current can be utilized to verify with as part of the verify operation. Further, that same or a similar current can be employed in a normal read with a lower voltage in the reverse direction to verify because current is exponentially reduced with lower voltage. Thus in some applications, it may be desirable to utilize larger currents in sensing circuitry because smaller currents may be susceptible to noise, and are typically more difficult to generate and to control. Further, the compact sensing circuitry of particular embodiments being applicable for both verify and read operations can save die size.

Figure 8:
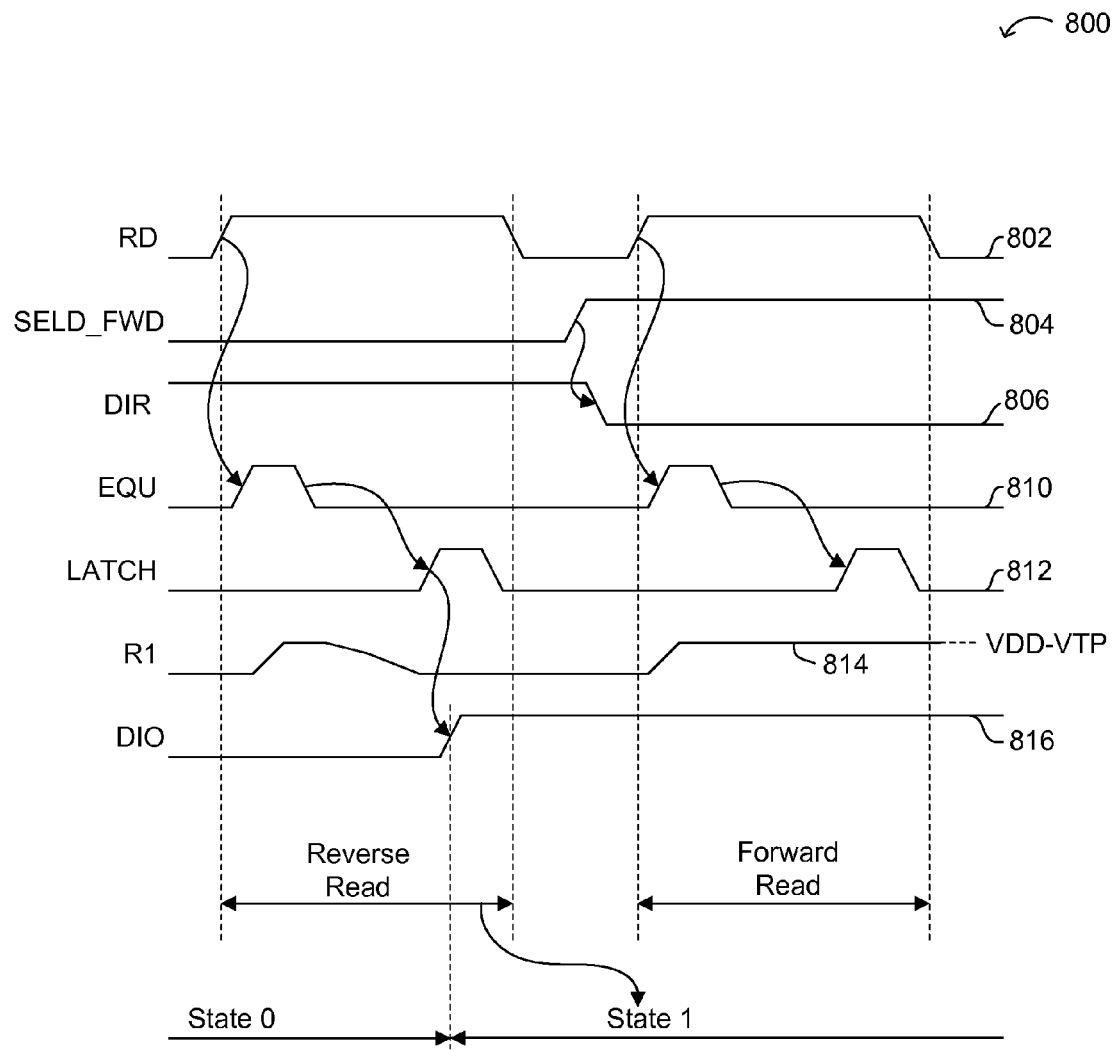
FIG. 8 is a waveform diagram of an example operation for the bipolar sensing circuit shown in FIG. 7.

Referring now to FIG. 8, shown is a waveform diagram of an example operation 800 for the bipolar sensing circuit shown in FIG. 7. In this particular example, the read control signal RD can go high to initiate a read operation, and two read operations are shown in waveform 802. Waveform 804 shows forward read control signal SELD_FWD, which can be low to indicate a reverse bias read, and may be high to indicate a forward bias read. Thus, the first read cycle in this example may be a reverse bias read, while the second read cycle may be a forward bias read. The direction indicator DIR can be high to indicate a reverse polarity, and low to indicate a forward polarity, as shown in waveform 806. Thus, the data can be inverted at DIO when DIR is high.

The equalization control signal EQU can be a high going pulse triggered off a rising edge of the read control signal RD. Thus, as shown in waveform 810, EQU may pulse high to provide a diode load (e.g., via PMOS transistors 702 and 704) at the start of the read cycle, and also to reset the data latch at the output of the sensing circuit. The latch control signal can be a high going pulse delayed from EQU. As shown in example waveform 812, the latch control signal may pulse a delay time away from a falling edge of EQU to allow time for signal development at node R1. As shown in example waveform 814, signal R1 can develop to a low level for the reverse read operation, and to a high level (e.g., VDD-VTP) for the forward read operation. Output signal DIO, as shown in waveform 816, may be low until the latch control signal allows an inversion of the developed signal at R1 to pass through to the latch, and may remain high for the subsequent forward read operation. The data latches may be reset at the end of each operation, and also at circuit power up.

In various resistive memory cells, resistances can change when measured from different bias (forward or reverse) directions. As such, a bipolar sensing as described herein can be used to read those different resistances. Further, such different resistances can be used to determine another data state of the memory cell, in contrast to the memory cell only storing two data states (1 and 0). Also, the nonlinear nature of the cell, such as for various erased cell states, can be considered to determine additional stored data states. For example, if a memory cell exhibits nonlinear behavior, a first data state may be indicated, and if the memory cell exhibits linear behavior, a second data state can be indicated. Various measurement techniques, such as a 3-point measurement to measure 3 points (e.g., middle, top, and bottom) on an IV curve, can be used to determine whether the cell is linear or nonlinear. This is in contrast to strictly using a current or resistance magnitude to determine data states for read levels. Thus in this case, the particular magnitude of a measurement may not be of concern, at least for one bit position of a multi-bit data state. Particular embodiments also support combinations of linear/nonlinear and magnitude versus threshold considerations for multi-bit data state reads.

Generally, the amount of filament or electrodeposits in a conductive bridge across a resistive memory element can make the memory cell essentially more or less linear. Thus, an array may be nonlinear when in an "off" or erased state. Once the memory cells are programmed, resistance decreases until appearing more like a resistance of a metal conductor. In this way, various erased states can vary to produce corresponding different nonlinear behavior based on filament or conductive bridge material formations. In particular embodiments, non-linear versus linear, as well as resistance value and directionality, can be considered and interpreted as multiple data bits stored in the resistive memory cell. Further, bipolar sensing approaches as described herein can be utilized in verification and other data state reading of the memory cell. Thus, because the resistance of a resistive memory cell (e.g., a CBRAM cell) may be characterized as linear or nonlinear, the linearity of the resistance can be used to determine the device state.

The nonlinearity of the resistance of a resistive memory cell can have several manifestations. The most common is between the off state and on state. Generally, in the off set, the resistance is nonlinear and follows an exponential curve. As the memory cell is programmed, the resistance or IV curve typically becomes more linear. In one example, three points of the curve can be measured, or the current at three bias voltages may be measured, to determine the linearity of the points, such as by looking at the differential linearity. In another approach, high and low trip values at each measurement point can be considered, and the resistance would need to fall within those points to be determined as linear.

Figure 9:
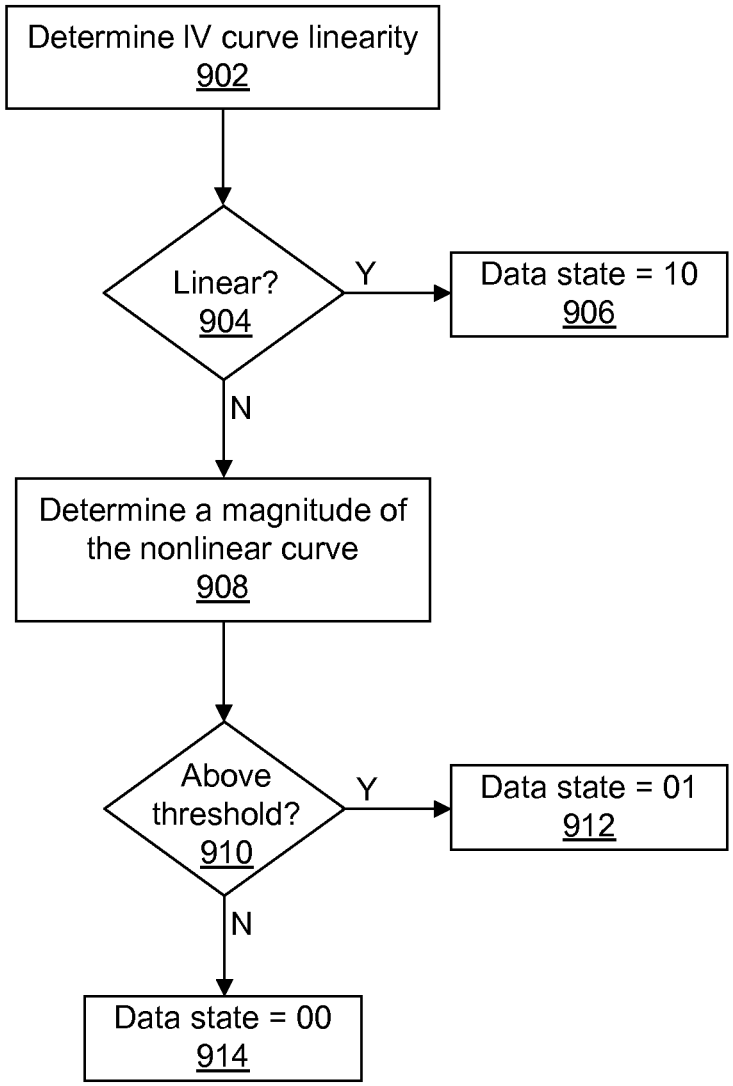
FIG. 9 is a flow diagram of example detection of a multi-bit data state of a resistive memory cell in accordance with embodiments of the present invention.

Referring now to FIG. 9, shown is a flow diagram 900 of example detection of a multi-bit data state of a resistive memory cell in accordance with embodiments of the present invention. In this example, linearity and magnitude considerations determine the multi-bit data state. However, other aspects (e.g., directional resistance) of resistive memory cells can also be considered for multi-bit data storage determinations in particular embodiments.

In this particular example, the IV curve linearity can be determined at 902. If the curve is determined as linear (904), the data state can be determined as a given multi-bit value (e.g., "10") at 906. However, if the curve is determined as nonlinear (904), a magnitude of one or more points on the curve can be considered for a data state determination at 908. If the magnitude is above a predetermined threshold (910), the data state can be determined as a given multi-bit value (e.g., "01") at 912. However, if the magnitude is below the predetermined threshold (910), the data state can be determined as a different multi-bit value (e.g., "00") at 914. In this way, more than two data states can be derived from a given resistive memory cell.

Figure 10:
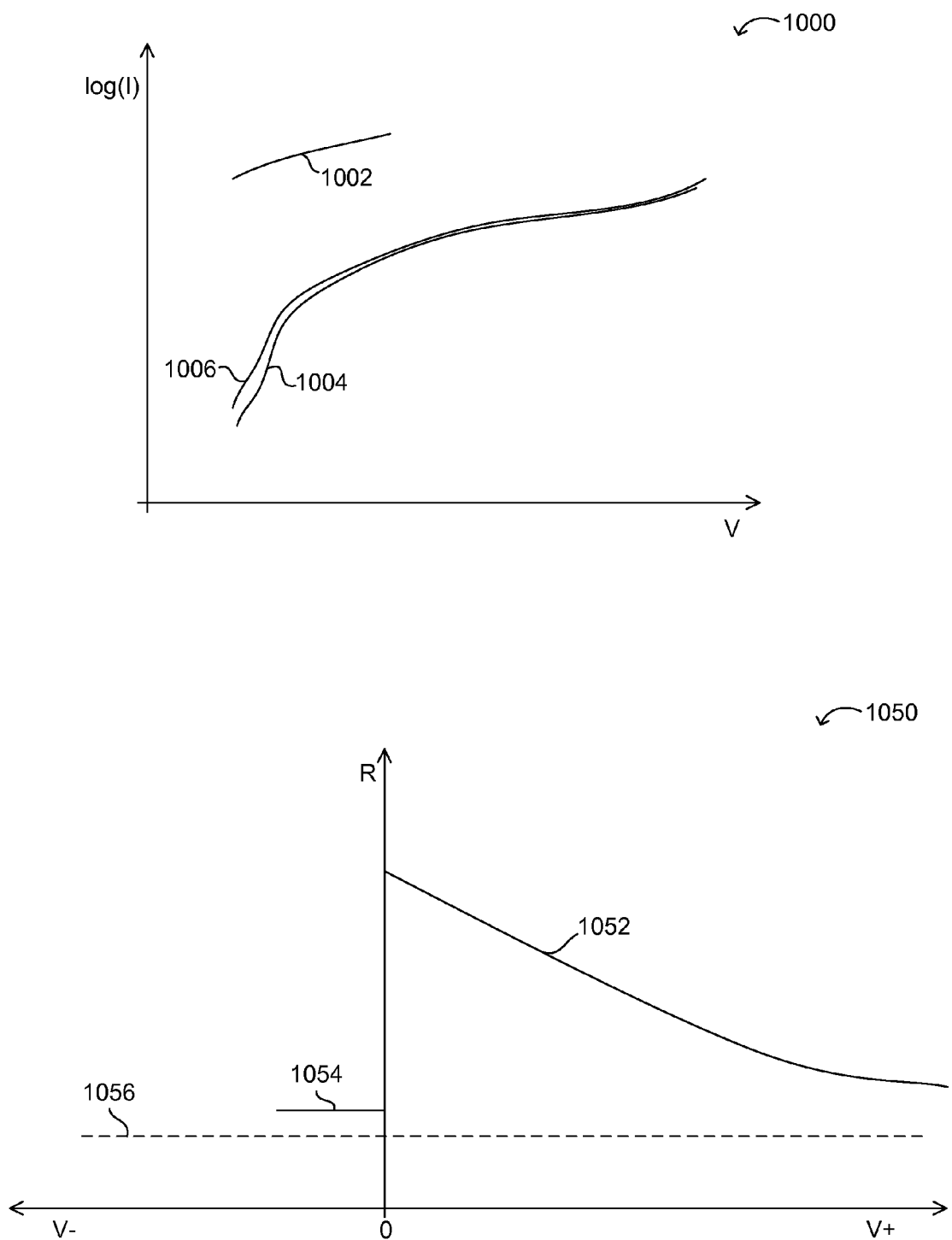
FIG. 10 shows example waveform diagrams for an IV curve and bidirectional cell resistance characteristics.

FIG. 10 shows example waveform diagrams for an IV curve 1000, and cell bidirectional resistance characteristics 1050. Example 1000 shows changes in a CBRAM IV curve as the device is programmed. For example, waveform 1002 may represent a programmed memory cell with substantially linear behavior. Waveforms 1004/1006 may represent erased cells exhibiting nonlinear behavior. The resistance of a resistive switching memory cell also can be bidirectional. That is, a resistance as measured with a positive anode to cathode voltage (forward bias) may be different from a resistance as measured with a negative anode to cathode voltages (reverse bias). For example, a negative voltage can yield a low resistance state, while a positive voltage from anode to cathode can give a higher resistance state. In addition, such a higher resistance state as measured with a forward bias may also be nonlinear, as shown in waveform 1052. The memory cell can be programmed to make the bidirectional resistance substantially go away such that the resistance is the same in both forward and reverse bias directions (see, e.g., waveform 1056). In particular embodiments, bidirectional read or sensing circuits can be configured as a bidirectional resistance detector to facilitate bidirectional resistance measurement of such a device.

Along these lines, the linearity of the resistance can also determine a data state of the memory cell. For example, the linearity of an IV curve of a resistive switching memory cell can represent storage of information in the resistive memory cell. As another example, the linearity information can be used to determine the program or erase operation. For instance, during the forming stages of the device, the linearity of the IV curve can be monitored to determine if the forming step has been successful, and thus if the memory cell is ready for normal usage. In this way, the linearity of an IV curve of a resistive switching memory cell can be detected, and this information can be utilized as a further data state determination, and/or to determine other memory cell characteristics (e.g., formation status, etc.).

Another phenomenon of resistive memory cells (e.g., GdOx CBRAM devices) involves bidirectional resistance differences, as discussed above. An example of such resistance direction variations is illustrated in 1050. Waveforms 1052 and 1054 show bidirectional resistance measurement differences while waveform 1056 shows a resistance that is the same in each forward/reverse bias direction. In particular embodiments, such bidirectional resistance characteristics can be utilized to store additional data states. For example, waveforms 1052 and 1054 exhibiting bidirectional resistance can represent one data state (e.g., data state "0"), while waveform 1056 exhibiting non-bidirectional resistance can represent another data state (e.g., data state "1"). Of course, other data state definitions, as well as data state bit positions in a multi-bit data storage memory cell, can be accommodated in certain embodiments. In one example, this bidirectional resistance property can be used to determine proper forming of the cell as the first program on a virgin cell. The forward and reverse direction resistance can be monitored and once they are close in value (e.g., less than a predetermined threshold apart), then the barriers of forming can be considered as overcome, and the device can be indicated as ready for normal operation.

In another method of using the IV curve to sense a memory cell data state is a two point read. For example, if $I_{read}(V)=I_1(V)+I_2(V)$, then it may be that the $I_1$ term changes during switching but the $I_2$ term does not change during switching. For an atomic wire, this can be true because their IV curves are normally written as $I(V)=A*V+B*V^3$, and the constant A changes as the wire gets thicker or thinner, but the nonlinear part normally stays the same. Also, if we have an $I_2$ term from, e.g., tunneling through the oxide, then this can be in parallel with the $I_1$ term from making/breaking the conductive bridge. As such, the memory effect may be substantially contained in only the $I_1$ term. Thus, with a 2-point read, the $I_2$ term may be eliminated, and the read may be based substantially on the $I_1$ term. The advantage is that the $I_2$ term may vary, so eliminating this term from the measurement may provide a clearer reading of the $I_1$ term controlled by the program/erase operations. Various approaches to determining bidirectional resistance can be supported in certain embodiments. For example, a memory cell read can determine if a resistance threshold has been tripped in both forward and reverse bias directions. If so, the memory cell may be detected as having a first data state, and if not the memory cell may be detected as having a different data state. In particular embodiments, a bipolar or bidirectional sense amplifier can be utilized in measuring the bidirectional resistance.

In this way, PMCs or other resistive switching memory cells may also each support more than one memory state. Further, depending on the voltage level controls, instead of a full erase or a full program/write, partial operations (e.g., by applying less/predetermined voltages for forward bias and reverse bias of the PMC, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance, linearity, bias voltage, and/or current characteristics.

As discussed above, a common plate anode architecture may be employed in resistive switching memory devices. If the bias of the array is not at the low rail (VSS or 0V), the leakage of the access transistors, over time, can have degrading effects on the memory device performance. Also, in order to quickly read at power-up, the bias of the array during read may be with respect to the low rail (VSS or 0V). The common anode plate is usually rather large, and thus has a relatively large capacitance associated therewith. In addition, polarization capacitance, parasitic routing, and junction capacitances of the programmed cells, can contribute to the overall capacitance. The most energy and performance in this architecture may be apportioned to access the memory cell at the cathode or bit line with a positive voltage with respect to VSS. This puts a negative or reverse bias from anode to cathode across the memory cell during a read operation. Such a reverse bias can reinforce an erased cell, but can disturb a programmed cell. In contrast to the approach of particular embodiments, conventional read circuitry does not discriminate between program and erased cells, which can allow for program disturbs.

Figure 11:
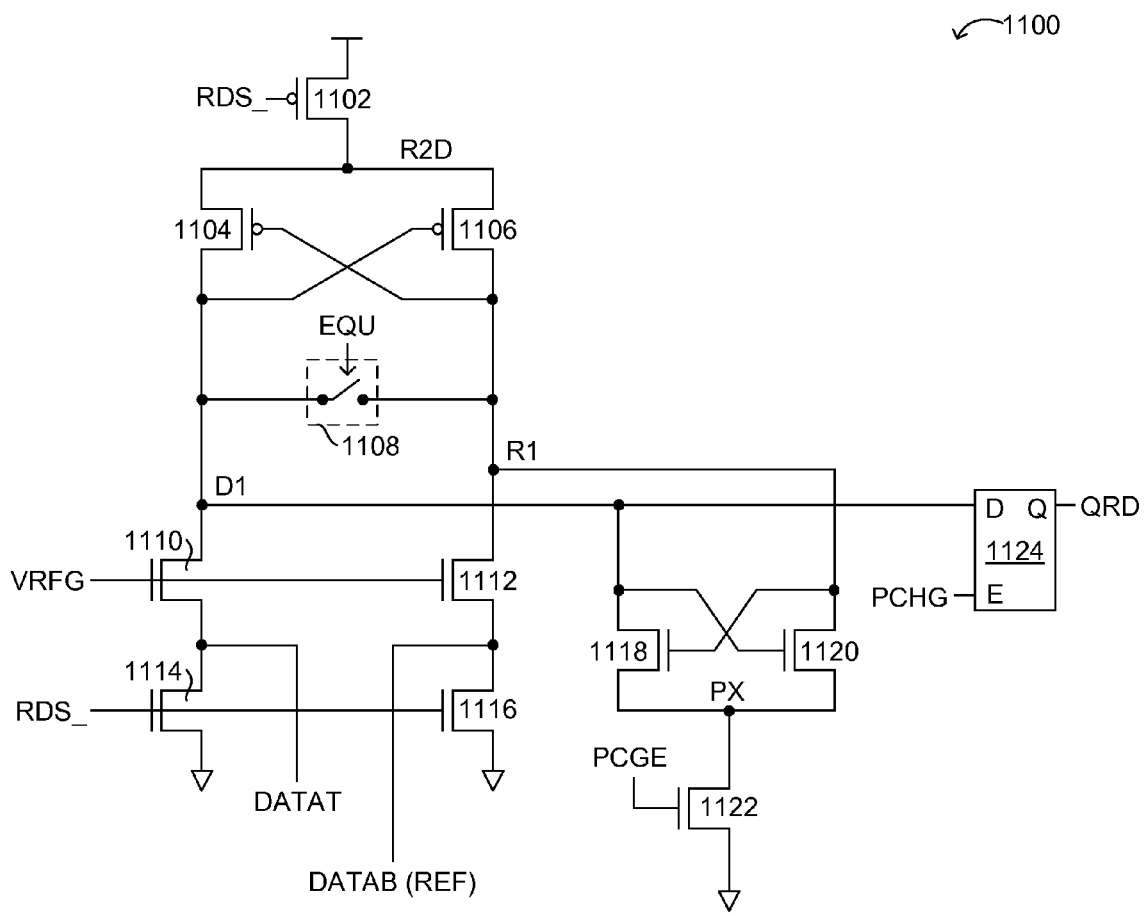
FIG. 11 is a schematic block diagram of a third example bipolar sensing circuit in accordance with embodiments of the present invention.

Referring now to FIG. 11, shown is a schematic block diagram of a third example bipolar sensing circuit 1100 in accordance with embodiments of the present invention. In this example, PMOS transistor 1102 can be controlled by a read control signal (RDS_), and may have its source connected to VDD, and its drain connected to node R2D. PMOS transistors 1104 and 1106 can be cross-coupled between nodes D1 and R1. Transistor 1104 can have a source connected to node R2D, a gate connected to node R1, and a drain connected to node D1. Transistor 1106 can have a source connected to node R2D, a gate connected to node D1, and a drain connected to node R1. A switch 1108 controlled by equalization control signal EQU can be connected between nodes D1 and R1 to equalize these nodes when EQU is activated.

NMOS transistors 1110 and 1112 can be controlled by reference voltage VRFG. Transistor 1110 can have a drain connected to node D1, and a source connected to node DATAT, which can be coupled to the memory cell to be accessed in the array. Transistor 1112 can have a drain connected to node R1, and a source connected to node DATAB, which can be coupled to a reference path for comparison against the accessed memory cell. NMOS transistors 1114 and 1116 can be controlled by read control signal RDS_, and each may have a source connected to VSS. Also, a drain of transistor 1114 can connect to DATAT, and a drain of transistor 1116 can connect to DATAB.

Cross-coupled NMOS transistors 1118 and 1120 can have their sources connected at node PX. Transistor 1118 can have a drain connected to node D1 and a gate connected to node R1, while transistor 1120 can have a drain connected to node R1 and a gate connected to node D1. NMOS transistor 1122 can be configured to sink current from node PX to ground based on control signal PCGE. Also, node D1 can connect to latch 1124 to provide a data signal for output QRD, when allowed based on enable signal PCHG (e.g., data is allowed into latch 1124 when PCHG is high, and data is secured in the latch when PCHG is low).

In this example circuit, sensing with a reverse bias and using cross-coupled PMOS transistor 1104/1106 loads can reduce cell disturb exposure. The reverse biased cell that is erased may thus see a large voltage across it that effectively reinforces the erase. The programmed cell then can limit the voltage across itself by pulling it down, and then cross-coupled NMOS transistors 1118/1120 can limit the voltage the rest of the way. Thus, transistors 1118 and 1120 can be employed in program disturb reduction. In this way, this example read or sensing circuit can sense a programmed cell, and force the voltage across the cell to ground to reduce exposure time of the programmed cell, and thus reduce associated disturbs.

Figure 12:
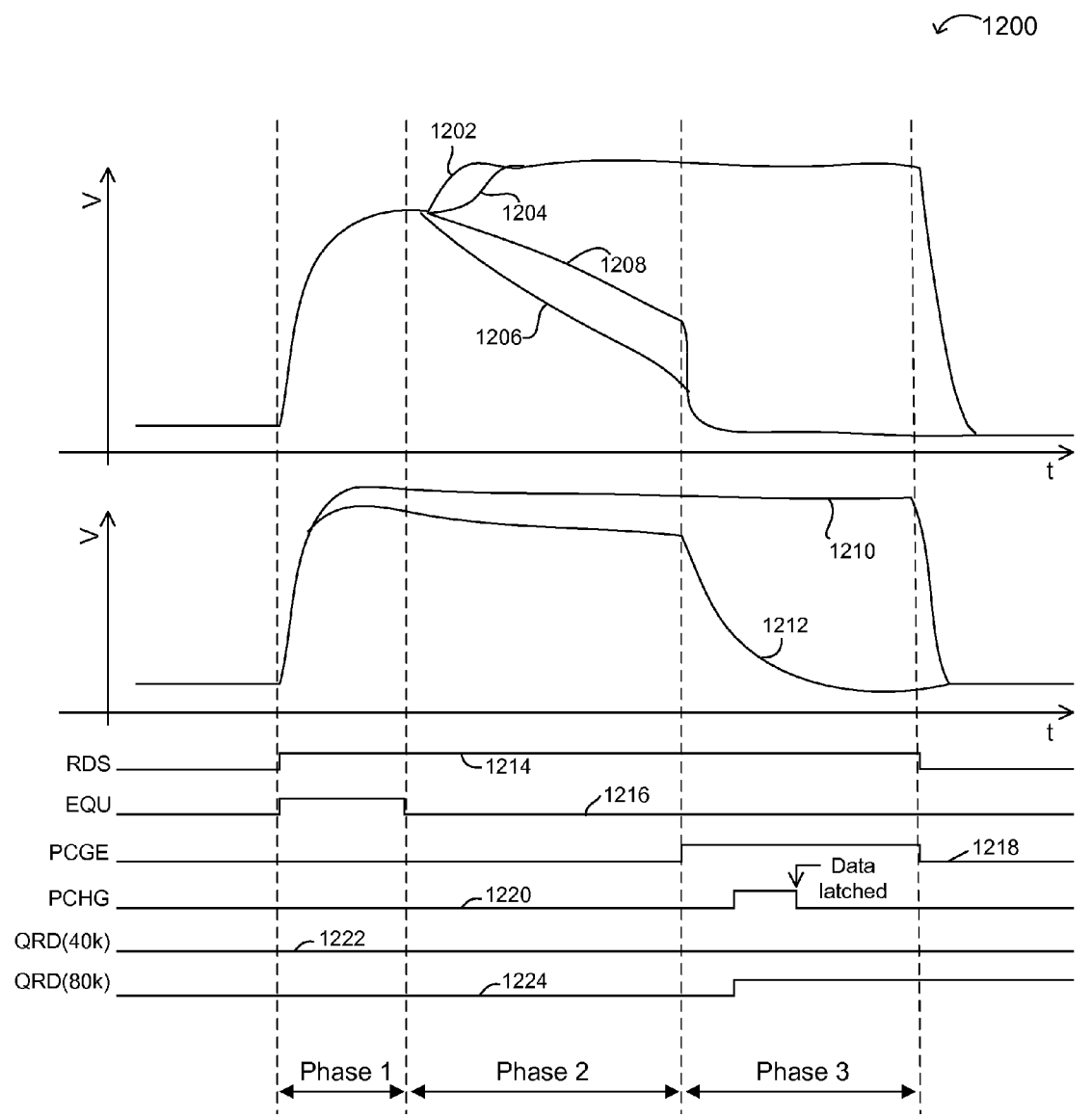
FIG. 12 shows example waveform diagrams of operation of the bipolar sensing circuit of FIG. 11.

FIG. 12 shows example waveform diagrams 1200 of operation of the bipolar sensing circuit of FIG. 11. In particular, example control signal timing diagrams for RDS, EQU, PCGE, PCHG, and QRD, are shown in respective waveforms 1214, 1216, 1218, 1220, and 1222/1224. The example circuit of FIG. 11 can have three predominant phases of operation. In phase 1, switch 1108 may be closed and transistors 1104 and 1106 can thus be diode-connected to allow for the average current from the memory cell and the reference to develop on nodes D1 and D2.

In phase 2, transistors 1104 at 1106 can be released (via switch 1108 opening by EQU going low) from diode connection, and reconfigured in a cross-coupled arrangement where the sensed signal is allowed to develop on nodes D1 and R1. The voltage on the memory cell and reference can be limited by source followers 1110 and 1112. The third phase, by activation of control signal PCGE, can allow cross-coupled NMOS transistors 1118 and 1120 to turn on and to continue to pull D1 or R1 to the low rail (VSS). As can be seen from the simulation result in FIG. 12, signal development on nodes D1 and R1 (see, e.g., waveforms 1202, 1204, 1206, and 1208 in the top portion of the diagram) can be seen as beginning during phase 2, and accelerating during phase 3. For example, waveforms 1202 and 1206 can represent nodes R1 and D1, respectively, for a memory cell with a 40 kΩ resistance. Also, waveforms 1208 and 1204 can represent nodes R1 and D1, respectively, for a memory cell with an 80 kΩ resistance. In this example, the memory cell with a 40 kΩ resistance can be detected as QRD remaining low (e.g., representing a data state 1) in waveform 1222, while the memory cell with an 80 kΩ resistance can be detected as QRD going high (e.g., representing a data state 0) in waveform 1224 when PCHG opens latch 1124. In this example, the resistance trip point can be set to about 60 kΩ. Thus, the 40 kΩ resistance memory cell can be detected as a programmed cell, while the 80 kΩ resistance memory cell can be detected as an erased cell.

Also, example simulation voltages at the cathode of the memory cell being accessed are shown in the middle portion of FIG. 12. Here, the 40 kΩ resistance memory cell cathode voltage may be brought to zero so as to not disturb the programmed memory cell, as shown in waveform 1212. In contrast, the 80 kΩ resistance memory cell, detected as an erased cell, may not have the voltage across the memory cell brought to zero during phase 3, as shown in waveform 1210, because this reverse bias reinforces instead of disturbs the memory cell.

It also should be noted that in phase 2 the programmed cell (e.g., the 40 kΩ resistance memory cell) can pull down the bit line at a rate of the pull up current minus the pull down current, limited by the bit line capacitance, which can be a relatively slow rate. Also, in phase 3, the cross-coupled NMOS transistors 1118 and 1120 can pull down the voltage across the memory cell to VSS by pushing source follower device 1110 back into the linear region where it can act as a low resistance switch. This can allow the voltage across the memory cell for the programmed memory cell to go to zero, thus limiting the exposure time and associated risk of cell disturb.

Another advantage of this approach is that cross-coupled NMOS transistors 1118/1120 and PMOS transistors 1104/1106 can also be used as the read latch. For example, a multiplexor can be included in series with transistors 1110 and 1112. As another example, regulation voltage VRFG can be discharged to VSS when RDS is low to enable this read latch. In another example, the EQU pulse can be designed to allow for voltage to be developed on D1 and R1 such that cross-coupled NMOS transistors 1118 and 1120 can be turned on sooner to further reduce the programmed memory cell voltage exposure time.

Figure 13:
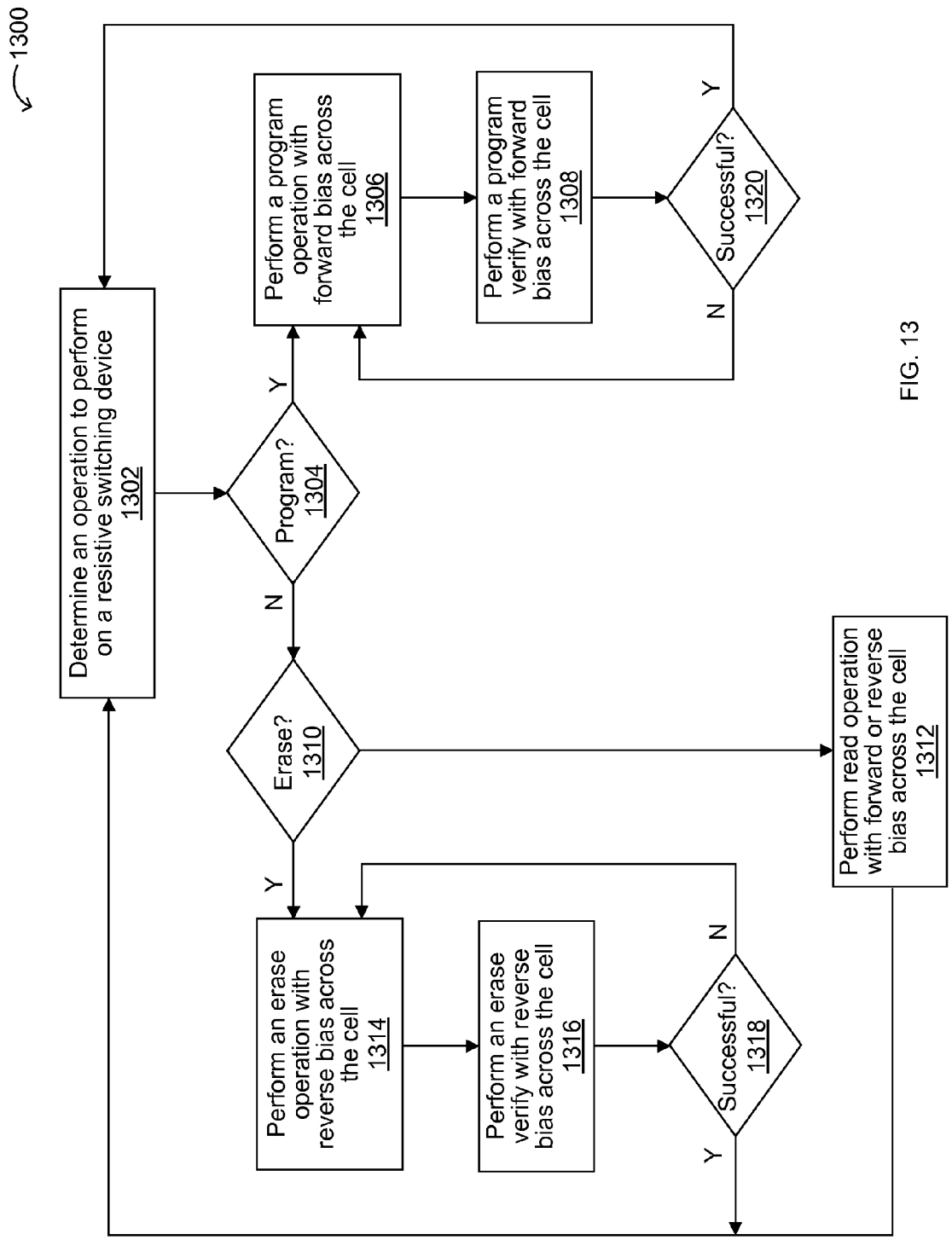
FIG. 13 is a flow diagram of an example method of operating a resistive switching memory device in accordance with embodiments of the present invention.

Referring now to FIG. 13, shown is a flow diagram 1300 of an example method of operating a resistive switching memory device in accordance with embodiments of the present invention. At 1302, an operation to be performed on a resistive switching memory device can be determined. At 1304, if the operation is a program operation, a program operation with a forward bias across the accessed memory cell can be performed at 1306. At 1308, a program verify operation can be performed, also with a forward bias across the cell. If the program verify determines that the cell has been successfully programmed at 1320, the flow can return to determine another operation to be performed on the device at 1302. However, if the program verify determines that the cell has not yet been successfully programmed at 1320, the flow can return to perform another program operation (e.g., with a longer pulsed with, higher voltage, etc.) with a forward bias across the memory cell at 1306.

At 1310, if the operation is an erase operation, an erase operation with a reverse bias across the accessed memory cell can be performed at 1314. At 1316, an erase verify operation can be performed, also with a reverse bias across the memory cell. If the erase verify determines that the cell has been successfully erased at 1318, the flow can return to determine another operation to be performed on the device at 1302. However, if the erase verify determines that the cell has not yet been successfully erased at 1318, the flow can return to perform another erase operation (e.g., with a longer pulsed with, adjusted voltage, etc.) with a reverse bias across the memory cell at 1314.

Also, if the operation is a standard read operation, this operation can be performed at 1312 with either a forward or reverse bias across the memory cell. In this way, cell disturb can be reduced by performing a program/erase verify by using a same bias direction as used in the underlying program/erase operation. Further, any of the sensing circuits discussed above can be configured to perform program verify, erase verify, and standard read operations as described herein. Thus, sensing circuits and approaches in particular embodiments can support flexible bias directions for reducing disturb of underlying program/erase operations, as well as improving correlation among the various operations. In addition, data states determined via such sensing circuits and approaches can be expanded to determine multi-bit data states in a single memory cell based on nonlinear/linear, resistance magnitude, and resistance directionality factors.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A resistive switching memory device, comprising:
   a) a plurality of resistive memory cells, wherein each of the resistive switching memory cells is configured to be programmed to a low resistance state by application of a first voltage in a forward bias direction, and to be erased to a high resistance state by application of a second voltage in a reverse bias direction; and
   b) a sensing circuit coupled to at least one of the plurality of resistive memory cells, wherein the sensing circuit is configured to read a data state of the at least one resistive memory cell by application of a third voltage in the forward bias direction, and wherein the sensing circuit is also configured to read the data state of the at least one resistive memory cell by application of the third voltage in the reverse bias direction.

2. The resistive switching memory device of claim 1, wherein the sensing circuit is configured to read the data state of the at least one resistive memory cell by application of the third voltage in the forward bias direction for a program verify operation.

3. The resistive switching memory device of claim 1, wherein the sensing circuit is configured to read the data state of the at least one resistive memory cell by application of the third voltage in the reverse bias direction for an erase verify operation.

4. The resistive switching memory device of claim 1, further comprising a linearity detector configured to determine a data state of the at least one resistive memory cell by detecting whether an IV curve of the at least one resistive memory cell is linear or nonlinear.

5. The resistive switching memory device of claim 4, wherein:
   a) the data state comprises a first data state when the IV curve is detected as linear; and
   b) the data state comprises a second data state when the IV curve is detected as nonlinear.

6. The resistive switching memory device of claim 5, further comprising an IV curve magnitude detector configured to detect a magnitude of the IV curve, and to compare the detected IV curve magnitude against a threshold, wherein the data state comprises a third data state based on a result of the comparison.

7. The resistive switching memory device of claim 1, wherein:
   a) each of the plurality of resistive memory cells comprises a programmable impedance element having an anode and a cathode;
   b) the forward bias direction comprises a higher voltage on the anode relative to the cathode; and
   c) the reverse bias direction comprises a higher voltage on the cathode relative to the anode.

8. A resistive switching memory device, comprising:
   a) a plurality of resistive memory cells, wherein each of the resistive switching memory cells is configured to be programmed to a low resistance state by application of a first voltage in a forward bias direction, and to be erased to a high resistance state by application of a second voltage in a reverse bias direction;
   b) a linearity detector configured to determine a data state of a selected resistive memory cell of the plurality of resistive memory cells by detecting whether an IV curve for the selected resistive memory cell is linear or nonlinear; and
   c) a bidirectional resistance detector configured to determine whether a resistance of the selected resistive memory cell is bidirectional based on a direction of an applied read bias, wherein the data state comprises a first data state when the resistance of the selected resistive memory cell is detected as bidirectional, and wherein the data state comprises a second data when the resistance of the selected resistive memory cell is detected as non-bidirectional.

9. The resistive switching memory device of claim 8, wherein:
   a) the data state comprises a third data state when the IV curve is detected as linear; and
   b) the data state comprises a fourth data state when the IV curve is detected as nonlinear.

10. The resistive switching memory device of claim 9, further comprising an IV curve magnitude detector configured to detect a magnitude of the IV curve, and to compare the detected IV curve magnitude against a threshold, wherein the data state comprises a fifth data state based on a result of the comparison.

11. The resistive switching memory device of claim 8, further comprising a sensing circuit configured to read a data state of the selected resistive memory cell by application of a third voltage in the forward bias direction, and to read the data state of the selected resistive memory cell by application of the third voltage in the reverse bias direction.

12. The resistive switching memory device of claim 11, wherein the third voltage is configured to be reduced to a ground level by the sensing circuit during a read operation when the selected resistive memory cell is programmed.

13. A method of controlling a resistive switching memory device, the method comprising:
   a) determining an operation to perform on a resistive memory cell in the resistive switching memory device;
   b) performing at least one program attempt with a first forward bias across the resistive memory cell, and performing, by a sensing circuit, at least one program verify with a second forward bias across the resistive memory cell when the determined operation is a program operation;
   c) performing at least one erase attempt with a first reverse bias across the resistive memory cell, and performing, by the sensing circuit, at least one erase verify with a second reverse bias across the resistive memory cell when the determined operation is an erase operation; and
   d) determining, by the sensing circuit, a data state of the memory cell when the determined operation is a read operation.

14. The method of claim 13, wherein:
   a) the resistive memory cell comprises a programmable impedance element having an anode and a cathode;
   b) each of the first and second forward biases comprises a higher voltage on the anode relative to the cathode; and
   c) each of the first and second reverse biases comprises a higher voltage on the cathode relative to the anode.

15. The method of claim 13, wherein the determining the data state comprises determining if an IV curve of the resistive memory cell is linear or nonlinear.

16. The method of claim 15, wherein:
a) the data state comprises a first data state when the IV curve is detected as linear; and
b) the data state comprises a second data state when the IV curve is detected as nonlinear.

17. The method of claim 16, further comprising:
a) detecting a magnitude of the IV curve; and
b) comparing the detected IV curve magnitude against a threshold, wherein the data state comprises a third data state based on a result of the comparison.

18. The method of claim 13, wherein the at least one program verify, the at least one erase verify, and the determining the data state for the read operation, each use a sensing circuit coupled to the resistive memory cell.

19. A resistive switching memory device, comprising:
a) a plurality of resistive memory cells, wherein each of the resistive switching memory cells is configured to be programmed to a low resistance state by application of a first voltage in a forward bias direction, and to be erased to a high resistance state by application of a second voltage in a reverse bias direction; and
b) a bidirectional resistance detector configured to determine a data state of a selected resistive memory cell of the plurality of resistive memory cells by detecting whether a resistance of the selected resistive memory cell is bidirectional or non-bidirectional, wherein the data state comprises a first data state when the resistance is detected as bidirectional, and wherein the data state comprises a second data state when the resistance is detected as non-bidirectional.

20. The resistive switching memory device of claim 19, wherein the resistance is detected as bidirectional when a measurement of the resistance in the forward bias direction is different from a measurement of the resistance in the reverse bias direction.

* * * * *